(12) United States Patent
    Chang

(10) Patent No.: US 12,328,835 B2
(45) Date of Patent: Jun. 10, 2025

(54) DISPLAY APPARATUS

(71) Applicant: AUO Corporation, Hsinchu (TW)

(72) Inventor: Yu-Lun Chang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 308 days.

(21) Appl. No.: 17/984,213

(22) Filed: Nov. 9, 2022

(65) Prior Publication Data

US 2023/0328902 A1    Oct. 12, 2023

(30) Foreign Application Priority Data

Apr. 7, 2022    (TW) .................................. 111113190

(51) Int. Cl.
    *H05K 5/30*    (2025.01)
    *H01L 25/16*    (2023.01)
(52) U.S. Cl.
    CPC ............. *H05K 5/30* (2025.01); *H01L 25/167* (2013.01)
(58) Field of Classification Search
    CPC ...................................................... H05K 5/30
    USPC ........................................................ 361/731
    See application file for complete search history.

(56) References Cited

U.S. PATENT DOCUMENTS

| 10,873,042 | B2 | 12/2020 | Zhang et al. |
| 11,211,445 | B2 | 12/2021 | Lin et al. |
| 2020/0083468 | A1 | 3/2020 | Zhang et al. |
| 2020/0163246 | A1* | 5/2020 | Yueh ................... H05K 7/1451 |
| 2021/0335155 | A1* | 10/2021 | Tang ................... H10H 29/142 |
| 2023/0207733 | A1 | 6/2023 | Gong et al. |

FOREIGN PATENT DOCUMENTS

| CN | 109192764 | 1/2019 |
| CN | 213025179 | 4/2021 |
| CN | 114255665 | 3/2022 |
| TW | 202213308 | 4/2022 |

\* cited by examiner

*Primary Examiner* — Hung S. Bui
(74) *Attorney, Agent, or Firm* — JCIPRNET

(57) ABSTRACT

A display apparatus includes at least one display panel that includes a substrate, a pixel array, a conductive device, and a protection adhesive. The pixel array is disposed on a front surface of the substrate. The conductive device is disposed at least on a sidewall of the substrate and electrically connected to the pixel array. The protection adhesive is disposed at least on the sidewall of the substrate and covers the conductive device. The protection adhesive has a first surface, a second surface, and a connecting surface which are disposed opposite to the sidewall of the substrate. A distance between the first surface and the sidewall of the substrate is greater than a distance between the second surface and the sidewall of the substrate. The connecting surface is connected to the first surface and the second surface.

11 Claims, 9 Drawing Sheets

DISPLAY APPARATUS

CROSS-REFERENCE TO RELATED APPLICATION

This application claims the priority benefit of Taiwan application serial no. 111113190, filed on Apr. 7, 2022. The entirety of the above-mentioned patent application is hereby incorporated by reference herein and made a part of this specification.

BACKGROUND

Technical Field

The disclosure relates to an optoelectronic apparatus and particularly relates to a display apparatus.

Description of Related Art

The popularization of display apparatuses leads to the extensive applications of the display apparatuses to home TVs, e-sports screens, large outdoor billboards, public information screens in stores, and even portable or wearable electronic apparatuses. In recent years, in addition to the continuous increase in the mainstream size of display panels, in response to consumers' demands for high-end electronic products, demands for good visual effects of the display apparatuses increase as well, whereas gaps between the display panels may affect the overall visual effect of the display apparatuses. Therefore, how to reduce the width of the gaps between the display panels is one of the important issues for developers.

SUMMARY

The disclosure relates to a display apparatus which may achieve good visual effects.

According to an embodiment of the disclosure, a display apparatus including at least one display panel is provided. The at least one display panel includes a substrate, a pixel array, a conductive device, and a protection adhesive. The substrate has a front surface, a back surface opposite to the front surface, and a sidewall connecting the front surface and the back surface. The pixel array is disposed on the front surface of the substrate. The conductive device is disposed at least on the sidewall of the substrate and electrically connected to the pixel array. The protection adhesive is disposed at least on the sidewall of the substrate and covers the conductive device. Here, the protection adhesive has a first surface, a second surface, and a connecting surface which are disposed opposite to the sidewall of the substrate. The first surface is located on the conductive device. A distance between the first surface and the sidewall of the substrate is greater than a distance between the second surface and the sidewall of the substrate, and the connecting surface is connected to the first surface and the second surface.

In an embodiment of the disclosure, an angle is included between the connecting surface and the second surface within the protection adhesive, and the angle is substantially equal to 90°.

In an embodiment of the disclosure, an angle is included between the connecting surface and the second surface within the protection adhesive, and the angle is greater than 0° and less than 90°.

In an embodiment of the disclosure, the connecting surface comprises a curved surface.

In an embodiment of the disclosure, the connecting surface includes a first sub-connecting surface and a second sub-connecting surface. The first sub-connecting surface is connected to the first surface. The second sub-connecting surface is connected to the first sub-connecting surface and the second surface. The first sub-connecting surface and the second sub-connecting surface are intersected.

In an embodiment of the disclosure, the protection adhesive includes a protruding portion and a flat portion. The protruding portion covers the conductive device and has the first surface and the connecting surface of the protection adhesive. The flat portion has the second surface of the protection adhesive. The protruding portion protrudes from the flat portion and is connected to the flat portion, so as to define a recess of the protection adhesive.

In an embodiment of the disclosure, the number of the at least one display panel is plural, and each of the display panels includes the substrate, the pixel array, the conductive device, and the protection adhesive. The display panels include a first display panel and a second display panel, and the protruding portion of the protection adhesive of the first display panel is disposed in the recess of the protection adhesive of the second display panel.

In an embodiment of the disclosure, a direction is substantially parallel to the sidewall of the substrate of the first display panel, and the conductive device of the first display panel and the conductive device of the second display panel are partially overlapped in the direction.

In an embodiment of the disclosure, in each of the display panels, an angle is included between the connecting surface and the second surface within the protection adhesive, and the angle in the first display panel is substantially equal to the angle in the second display panel.

In an embodiment of the disclosure, in each of the display panels, an angle is included between the connecting surface and the second surface within the protection adhesive, and the angle in the first display panel is greater than the angle in the second display panel.

In an embodiment of the disclosure, in each of the display panels, an angle is included between the connecting surface and the second surface within the protection adhesive, and the angle in the first display panel is less the angle in the second display panel.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
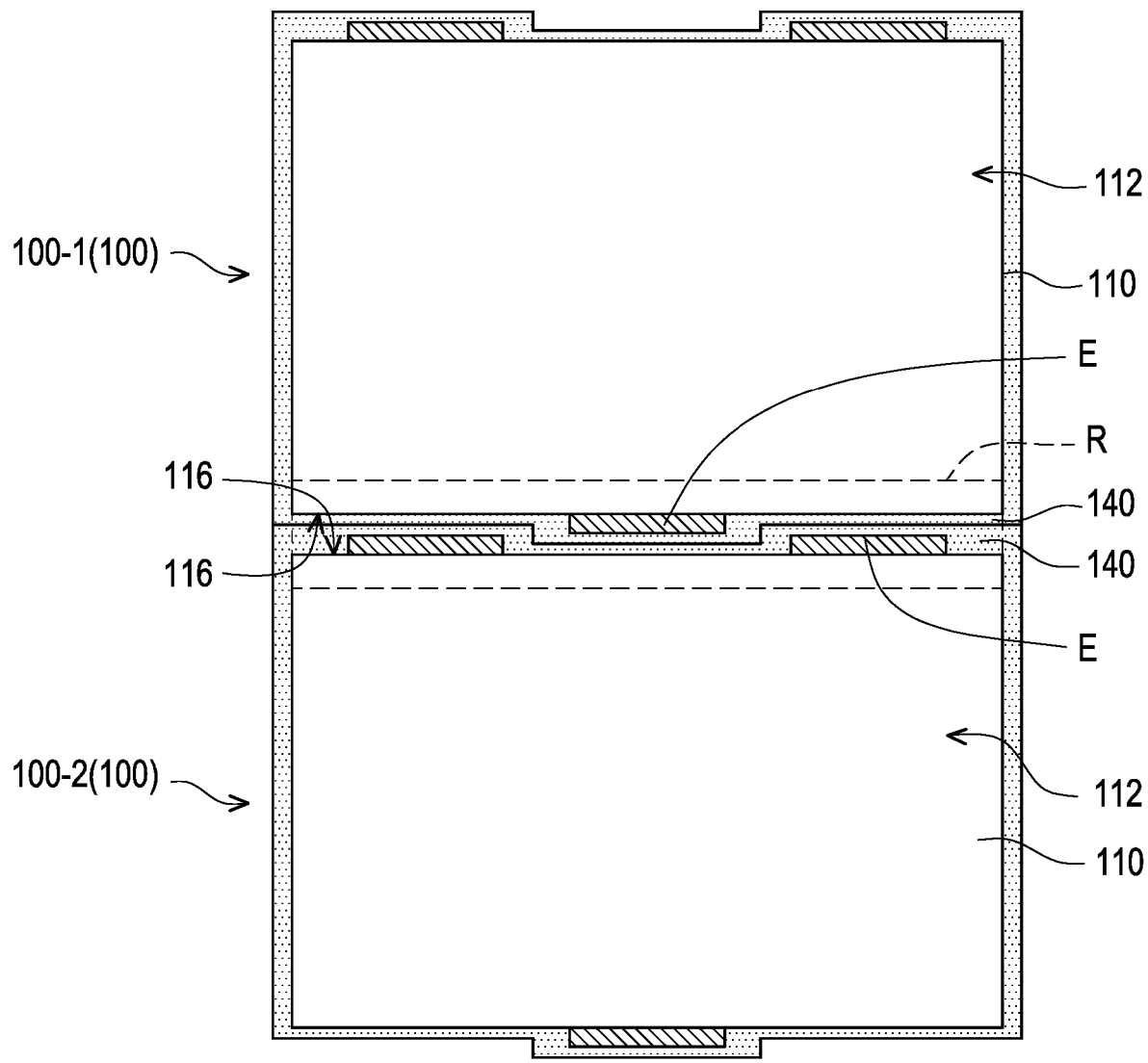
FIG. 1 is a schematic top view of a display apparatus 10 according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

It should be understood that when an element such as a layer, film, region, or substrate is referred to as being "on" or "connected to" another element, it can be directly on or connected to the other element, or intervening elements may also be present between said element and said another element. In contrast, when an element is referred to as being "directly on" or "directly connected to" another element, there are no intervening elements present between said element and said another element. As used herein, the terminology "connected" may refer to physically connected and/or electrically connected. Therefore, intervening elements may be present between two elements when the two elements are "electrically connected" or "coupled" to each other.

The terminology "about," "approximately," or "substantially" as used herein is inclusive of the stated value and means within an acceptable range of deviation for the particular value as determined by persons of ordinary skill in the art, considering the measurement in question and the error associated with measurement of the particular quantity (i.e., the limitations of the measurement system). For instance, "approximately" may mean within one or more standard deviations, or within, for instance, ±30%, ±20%, ±10%, ±5% of the stated value. Moreover, a relatively acceptable range of deviation or standard deviation may be chosen for the terminology "about," "approximately," or "substantially" as used herein based on optical properties, etching properties or other properties, instead of applying one standard deviation across all the properties.

Unless otherwise defined, all terminologies (including technical and scientific terminologies) used herein have the same meaning as commonly understood by persons of ordinary skill in the art. It will be further understood that terminologies, such as those defined in commonly used dictionaries, should be interpreted as having a meaning that is consistent with their meaning in the context of the relevant art and the disclosure and will not be interpreted in an idealized or overly formal sense unless expressly so defined herein.

FIG. 1 is a schematic top view of a display apparatus 10 according to an embodiment of the disclosure.

Figure 2:
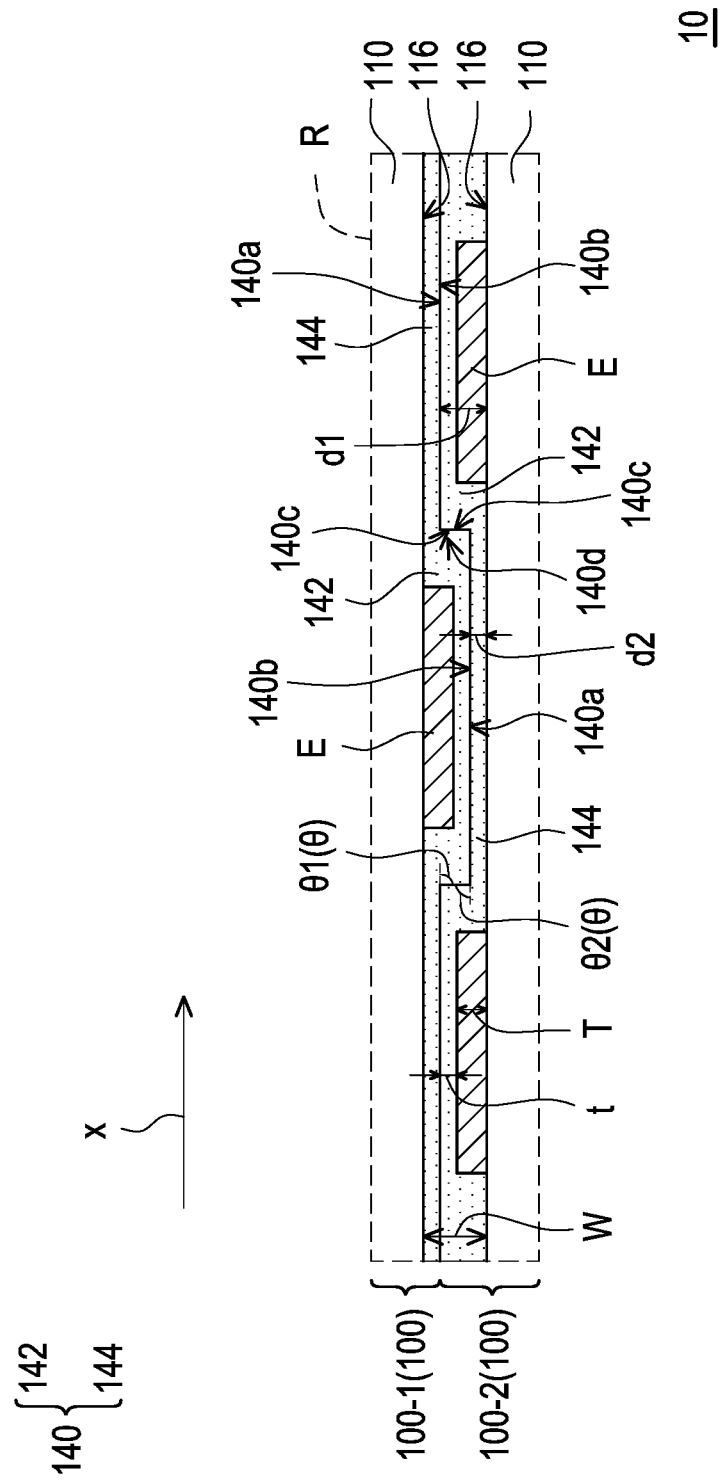
FIG. 2 is a schematic partial enlarged view of the display apparatus 10 according to an embodiment of the disclosure.

FIG. 2 is a schematic partial enlarged view of the display apparatus 10 according to an embodiment of the disclosure. FIG. 2 corresponds to a portion R in FIG. 1.

Figure 3:
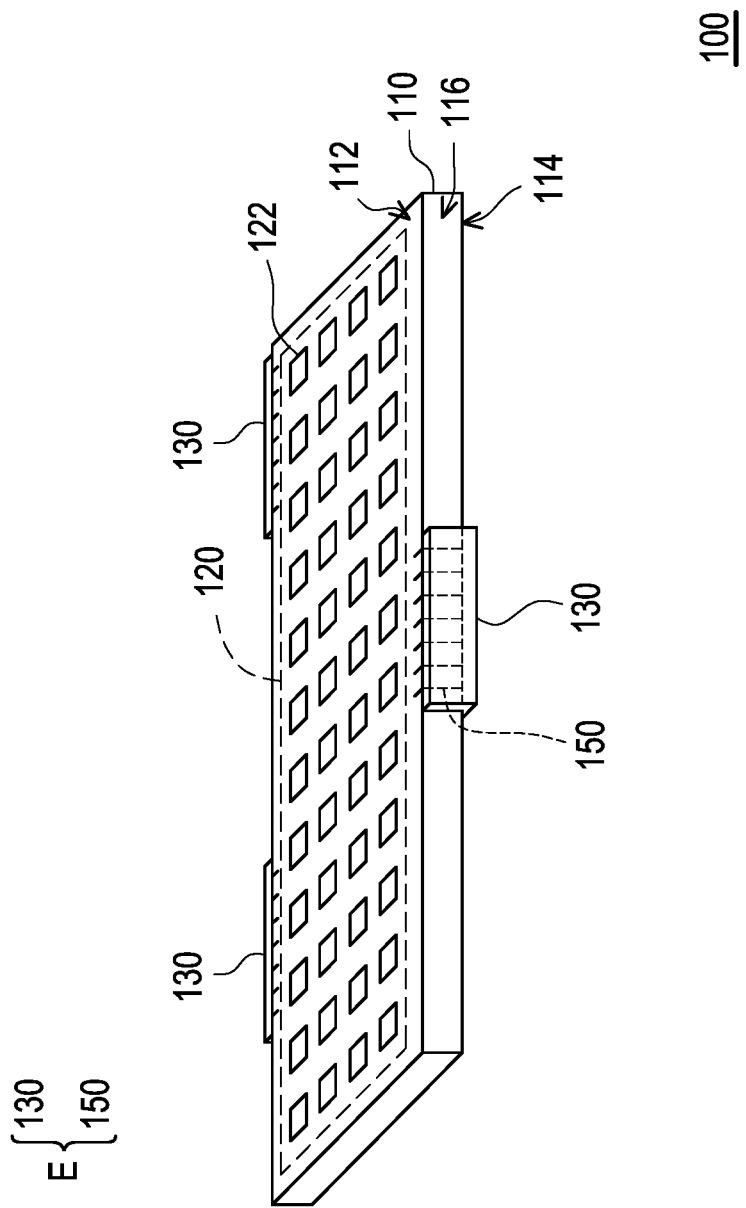
FIG. 3 is a schematic three-dimensional view of a display pane 1100 of the display apparatus 10 according to an embodiment of the disclosure.

FIG. 3 is a schematic three-dimensional view of a display panel 100 of the display apparatus 10 according to an embodiment of the disclosure. A protection adhesive 140 depicted in FIG. 1 and FIG. 2 is omitted from FIG. 3, and a pixel array 120 and a side wiring 150 depicted in FIG. 3 are omitted from FIG. 1 and FIG. 2.

With reference to FIG. 1, the display apparatus 10 includes at least one display panel 100. For instance, in this embodiment, the display apparatus 10 may include splicing display panels 100, and the display panels 100 include a first display panel 100-1 and a second display panel 100-2, which should however not be construed as a limitation in the disclosure. In other embodiments, the display apparatus 10 may include one display panel 100.

With reference to FIG. 1 and FIG. 3, each of the display panels 100 includes a substrate 110 which has a front surface 112, a back surface 114 opposite to the front surface 112, and a sidewall 116 connecting the front surface 112 and the back surface 114. For instance, in this embodiment, a material of the substrate 100 may be glass, quartz, organic polymer, or an opaque/reflective material (e.g., wafer, ceramics, or other appropriate materials), or other appropriate materials.

Each of the display panels 100 further includes the pixel array 120 (depicted in FIG. 3) that is disposed on the front surface 112 of the substrate 110. The pixel array 120 includes a plurality of pixel structures 122 arranged in an array. For instance, in this embodiment, each of the pixel structures 122 may include a data line (not shown), a scan line (not shown), a power line (not shown), a common line (not shown), a pixel driver circuit (not shown), and at least one light emitting diode (LED) device (not shown). The pixel driver circuit (not shown) of each pixel structure 122 may include a first transistor (not shown), a second transistor (not shown), and a capacitor (not shown). A first terminal of the first transistor is electrically connected to the data line, a control terminal of the first transistor is electrically connected to the scan line, a second terminal of the first transistor is electrically connected to a control terminal of the second transistor, a first terminal of the second transistor is electrically connected to the power line, the capacitor is electrically connected to the second terminal of the first transistor and the first terminal of the second transistor, a second terminal of the second transistor is electrically connected to a first electrode of the at least one LED device, and a second electrode of the at least one LED device is electrically connected to the common line, which should however not be construed as limitations in the disclosure; in other embodiments, each of the pixel structures 122 may also be in other forms.

With reference to FIG. 1, FIG. 2, and FIG. 3, each of the display panels 100 further includes a conductive device E which is disposed at least on the sidewall 116 of the substrate 110 and electrically connected to the pixel array 120. For instance, in this embodiment, each display panel 100 further includes a plurality of side wirings 150 disposed on the sidewall 116 of the substrate 110, the side wirings 150 are electrically connected to the pixel array 120, and the conductive device E includes, for instance, the side wirings 150 and a chip on film (COF) package 130 bonded to the side wirings 150, which should however not be construed as limitations in the disclosure; in another embodiment, the conductive device E may also include the side wirings 150 but not the COF package 130. In addition, in this embodiment, the conductive device E is, for instance, disposed on the sidewall 116 of the substrate 110, which should however not be construed as a limitation in this disclosure; in other embodiments, the conductive device E may also extend downward from an edge of the front surface 112 of the substrate 110 at least to the sidewall 116 of the substrate 110.

With reference to FIG. 1 and FIG. 2, each display panel 100 further includes a protection adhesive 140 which is disposed at least on the sidewall 116 of the substrate 110 and covers the conductive device E. The protection adhesive 140 has a first surface 140a, a second surface 140b, and a connecting surface 140c that are disposed opposite to the sidewall 116 of the substrate 110. The first surface 140a is located on the conductive device E. A distance d1 between the first surface 140a and the sidewall 116 of the substrate 110 is greater than a distance d2 between the second surface 140b and the sidewall 116 of the substrate 110, and the connecting surface 140c is connected to the first surface 140a and the second surface 140b.

In this embodiment, the protection adhesive 140 includes a protruding portion 142 and a flat portion 144. Here, the protruding portion 142 covers the conductive device E and has the first surface 140a and the connecting surface 140c of the protection adhesive 140, the flat portion 144 has the second surface 140b of the protection adhesive 140, and the protruding portion 142 protrudes from and is connected to the flat portion 144 to define a recess 140d of the protection adhesive 140.

In this embodiment, the display apparatus 10 may be selectively formed by splicing the first display panel 100-1 and the second display panel 100-2. After the first display panel 100-1 is spliced with the second display panel 100-2, the protruding portion 142 of the protection adhesive 140 of the first display panel 100-1 is disposed in the recess 140d of the protection adhesive 140 of the second display panel 100-2. The first surface 140a of the protection adhesive 140 of the first display panel 100-1 leans against the second surface 140b of the protection adhesive 140 of the second display panel 100-2, the second surface 140b of the protection adhesive 140 of the first display panel 100-1 leans against the first surface 140a of the protection adhesive 140 of the second display panel 100-2, and the connecting surface 140c of the protection adhesive 140 of the first display panel 100-1 is disposed beside the connecting surface 140c of the protection adhesive 140 of the second display panel 100-2. The first surface 140a of the protection adhesive 140 of the first display panel 100-1 is substantially parallel to the second surface 140b of the protection adhesive 140 of the second display panel 100-2. The second surface 140b of the protection adhesive 140 of the first display panel 100-1 is substantially parallel to the first surface 140a of the protection adhesive 140 of the second display panel 100-2. A direction x is substantially parallel to the sidewall 116 of the substrate 110 of the first display panel 100-1. The conductive device E of the first display panel 100-1 and the conductive device E of the second display panel 100-2 are alternately arranged in the direction x.

It is worth mentioning that, in this embodiment, the protruding portion 142 of the protection adhesive 140 of the first display panel 100-1 is disposed in the recess 140d of the protection adhesive 140 of the second display panel 100-2. Therefore, a width W of a gap between the first display panel 100-1 and the second display panel 100-2 that are spliced to form the display apparatus 10 (i.e., the distance from the sidewall 116 of the substrate 110 of the first display panel 100-1 to the sidewall 116 of the substrate 110 of the second display panel 100-2) may be significantly reduced, which contributes to the improvement of the overall visual effect of the display apparatus 10.

In this embodiment, the first surface 140a, the second surface 140b, and the connecting surface 140c of the protection adhesive 140 of each display panel 100 may be formed by applying a laser cutting protection adhesive material (not shown). The protective adhesive 140 of each display panel 100 has a thickness t on the conductive device E, the minimum value of the thickness t may be equal to a size tmin of a heat affected zone of the laser, and the minimum distance from the first surface 140a of the protection adhesive 140 to the sidewall 116 of the substrate 110 of each display panel 100 may be (tmin+T), where T is a thickness of the conductive device E. The width W of the gap in the display apparatus 10 may be smaller than (2·tmin+ 2·T). To be specific, in this embodiment, the width W of the gap in the display apparatus 10 may be smaller than (tmin+ 2·T), which should however not be construed as a limitation in the disclosure.

With reference to FIG. 1 and FIG. 2, an angle θ1 is included between the connecting surface 140c and the second surface 140b within the protection adhesive 140 of the first display panel 100-1. An angle θ2 is included between the connecting surface 140c and the second surface 140b within the protection adhesive 140 of the second display panel 100-2. In this embodiment, the angle θ1 in the first display panel 100-1 and the angle θ2 in the second display panel 100-2 may be substantially equal. For instance, in this embodiment, the angle θ1 is substantially equal to 90°, and the angle θ2 is substantially equal to 90°, which should however not be construed as a limitation in the disclosure. In other embodiments, the angle θ1 and the angle θ2 are not necessarily equal and may have other values, which will be described below with reference to other accompanying drawings.

With reference to FIG. 1 and FIG. 2, in this embodiment, the connecting surface 140c of the protection adhesive 140 of each display panel 100 may selectively be a flat surface, which should however not be construed as a limitation in the disclosure. In other embodiments, the connecting surface 140c of the protection adhesive 140 may also be a curved surface, and the curved surface may be a convex surface or a concave surface, which will be described below with reference to other accompanying drawings.

Note that the reference numbers and some content provided in the following embodiments are derived from the reference numbers and some content provided in the previous embodiments, the same reference numbers serve to denote the same or similar devices, and the description of the same technical content is omitted. The omitted description may be derived from the description provided in the previous embodiments and will not be repeated in the following embodiments.

Figure 4:
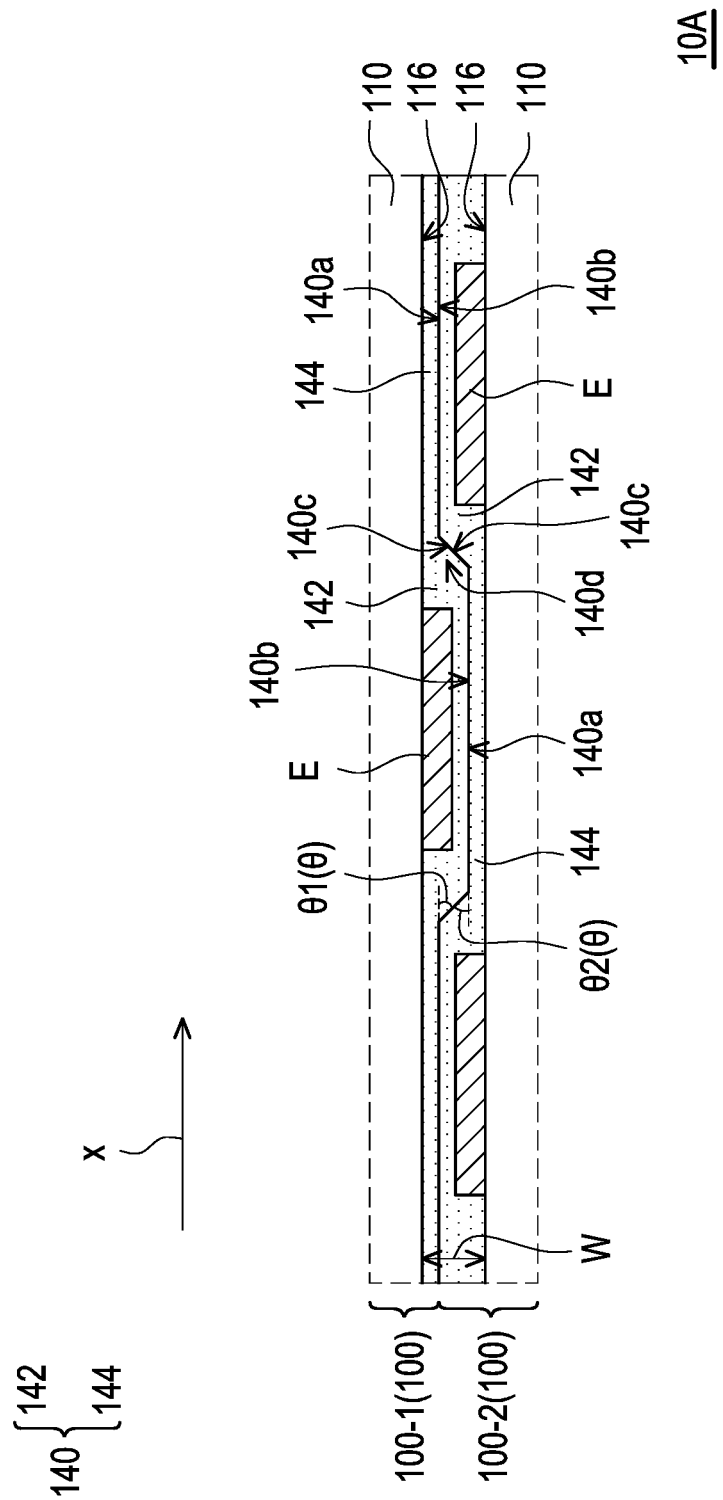
FIG. 4 is a schematic partial enlarged view of a display apparatus 10A according to another embodiment of the disclosure.

FIG. 4 is a schematic partial enlarged view of a display apparatus 10A according to another embodiment of the disclosure. The display apparatus 10A depicted in FIG. 4 is similar to the display apparatus 10 depicted in FIG. 2, while the difference therebetween lies in that the angles θ1 and θ2 in the display apparatus 10A are different from the angles θ1 and θ2 in the display apparatus 10.

With reference to FIG. 4, in this embodiment, the angles θ1 and θ2 are the same, while the difference between the embodiment depicted in FIG. 4 and the embodiment depicted in FIG. 2 lies in that the angles θ1 and θ2 are greater than 0° and less than 90° according to the embodiment depicted in FIG. 4. That is, an end of the recess 140d of each of the display panels 100 away from the sidewall 116 of the substrate 110 has a relatively large width. Thereby, the first display panel 100-1 and the second display panel 100-2 may be easily engaged with each other, and the width W of the gap may stay small.

Figure 5:
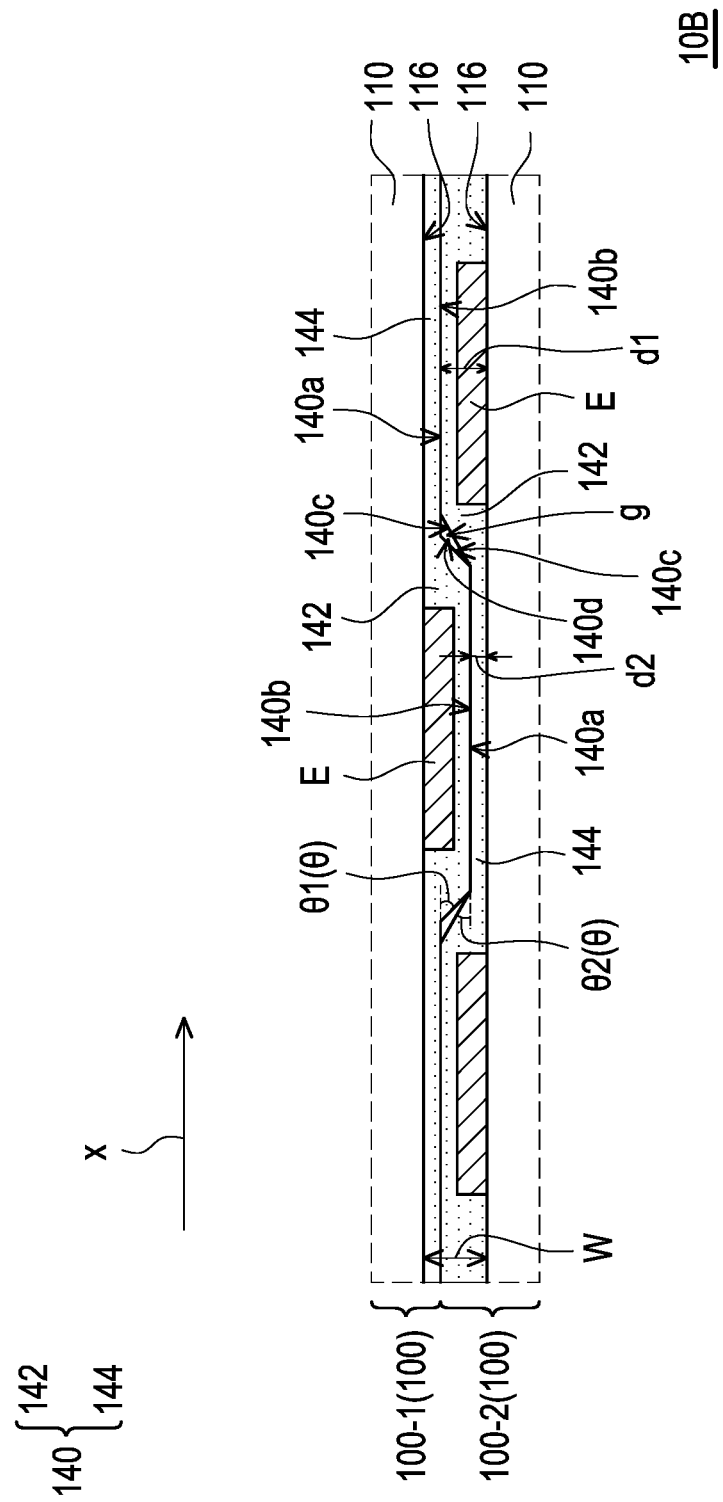
FIG. 5 is a schematic partial enlarged view of a display apparatus 10B according to still another embodiment of the disclosure.

FIG. 5 is a schematic partial enlarged view of a display apparatus 10B according to another embodiment of the disclosure. The display apparatus 10B depicted in FIG. 5 is similar to the display apparatus 10A depicted in FIG. 4, while the differences therebetween lie in that the angles θ1 and θ2 in the display apparatus 10B are different from the angles θ1 and θ2 in the display apparatus 10A, and that a gap g exists between the connecting surface 140c of the protection adhesive 140 of the first display panel 100-1 and the connecting surface 140c of the protection adhesive 140 of the second display panel 100-2. With reference to FIG. 5, for instance, in this embodiment, the angle θ1 may be greater than the angle θ2, which should however not be construed as a limitation in the disclosure.

Figure 6:
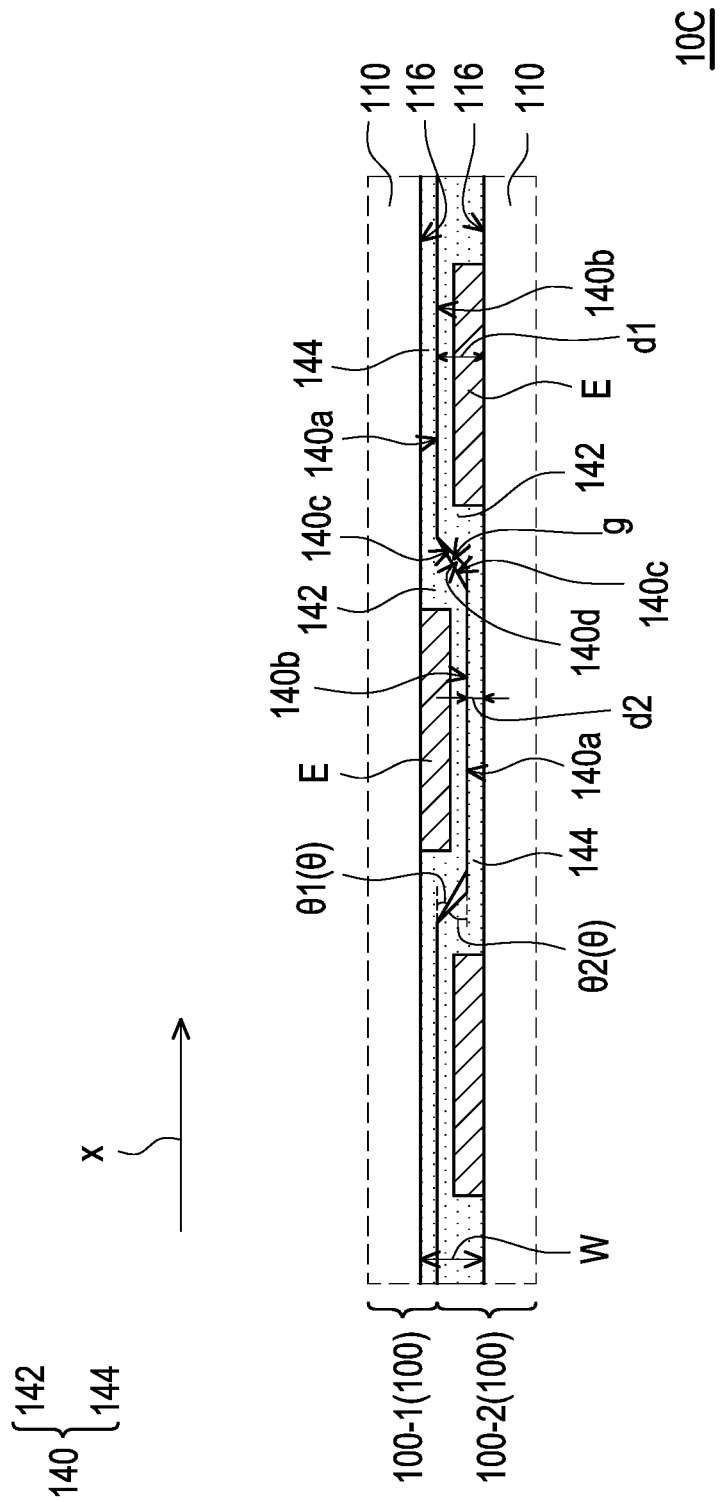
FIG. 6 is a schematic partial enlarged view of a display apparatus 10C according to still another embodiment of the disclosure.

FIG. 6 is a schematic partial enlarged view of a display apparatus 10C according to still another embodiment of the disclosure. The display apparatus 10C depicted in FIG. 6 is similar to the display apparatus 10B depicted in FIG. 5, while the difference therebetween lies in that the angle θ1 is less than the angle θ2 according to the embodiment depicted in FIG. 6.

Figure 7:
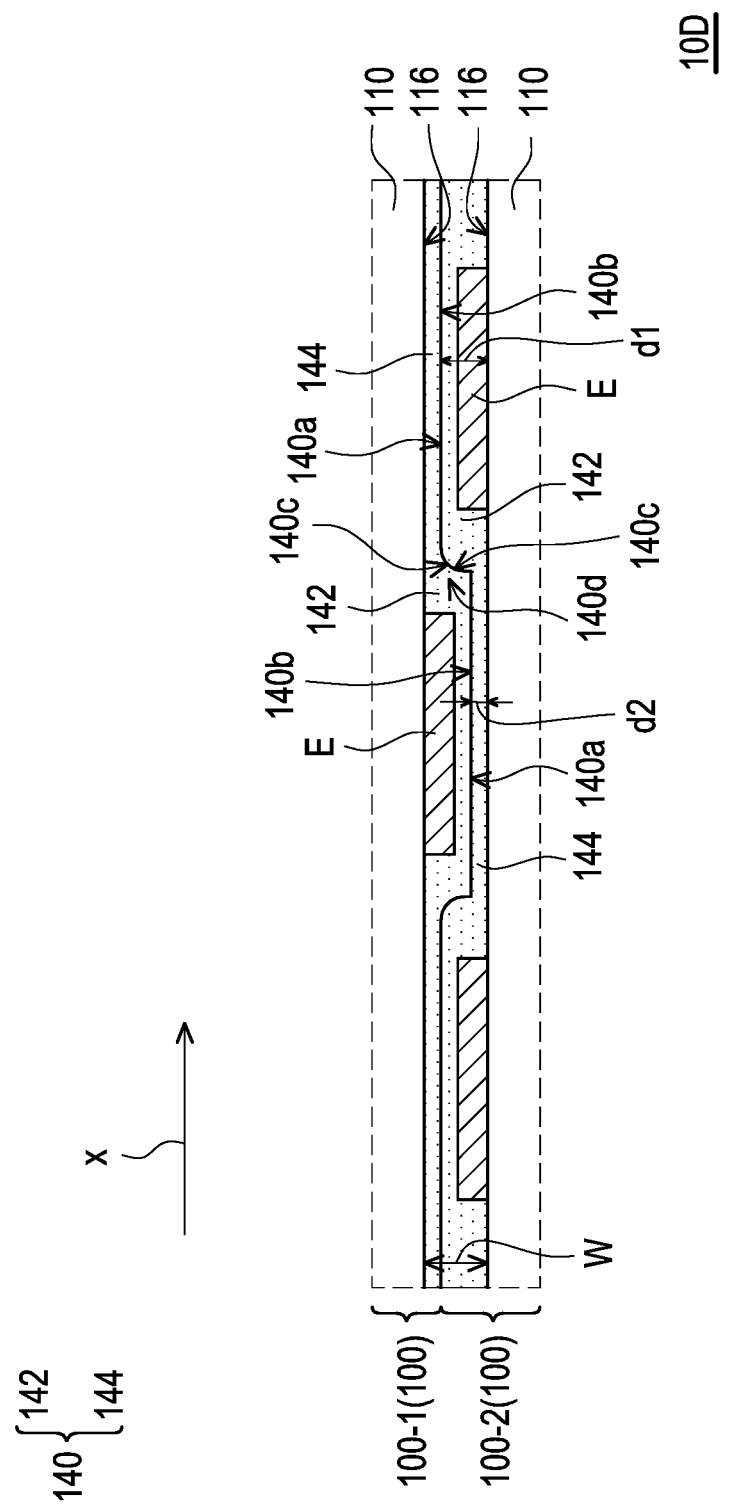
FIG. 7 is a schematic partial enlarged view of a display apparatus 10D according to an embodiment of the disclosure.

FIG. 7 is a schematic partial enlarged view of a display apparatus 10D according to an embodiment of the disclosure. The display apparatus 10D depicted in FIG. 7 is similar to the display apparatus 10 depicted in FIG. 2, while the difference therebetween lies in that the connecting surface 140c of the display apparatus 10D is different from the connecting surface 140c of the display apparatus 10. With reference to FIG. 7, specifically, in this embodiment, the connecting surface 140c of the protection adhesive 140 of each of the display panels 100 may be a curved surface, and the curved surface may be a convex surface or a concave surface. For instance, in this embodiment, the connecting surface 140c of the protection adhesive 140 of the first display panel 100-1 may be a concave arc surface, and the connecting surface 140c of the protection adhesive 140 of the second display panel 100-2 may be a convex arc surface.

Figure 8:
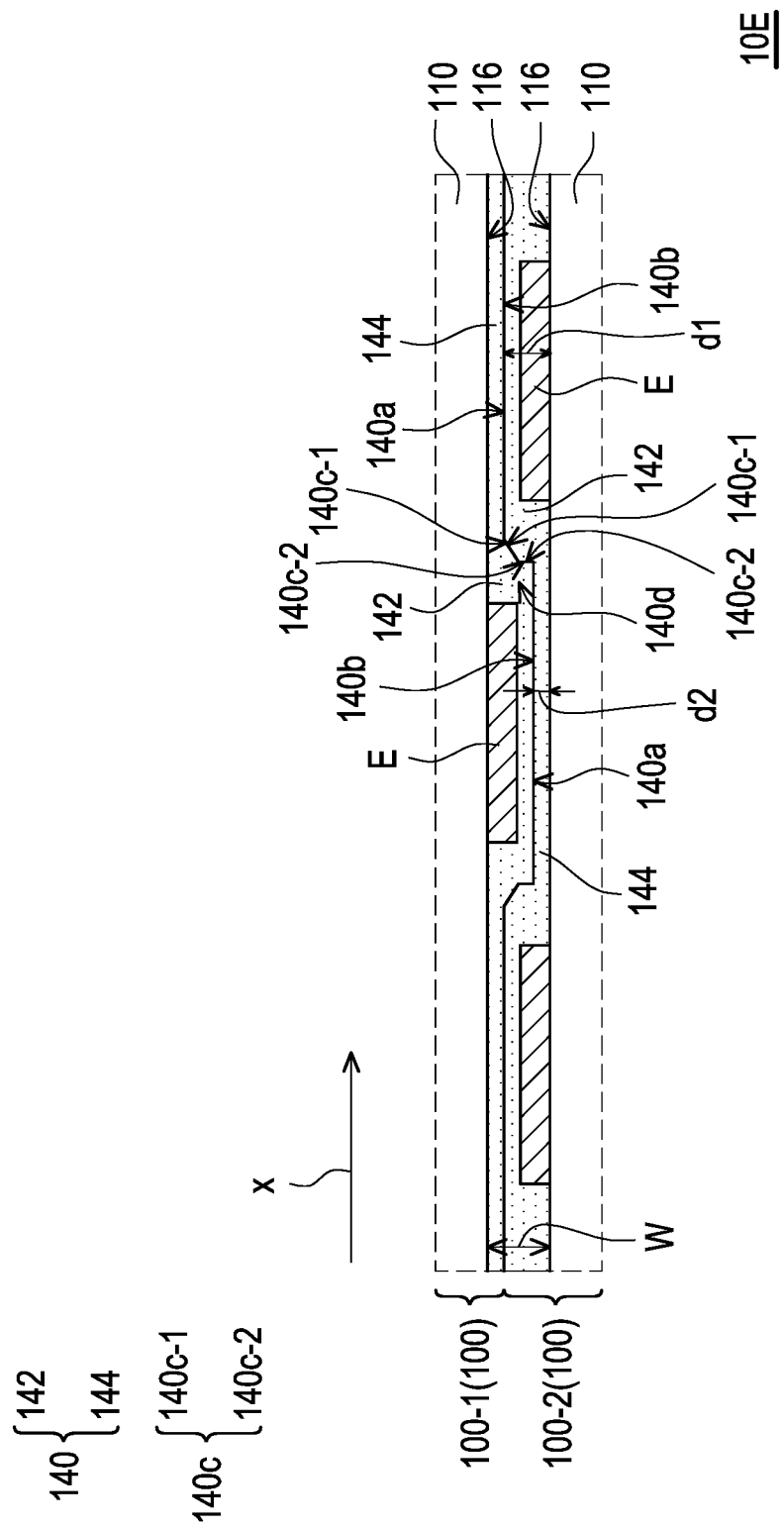
FIG. 8 is a schematic partial enlarged view of a display apparatus 10E according to another embodiment of the disclosure.

FIG. 8 is a schematic partial enlarged view of a display apparatus 10E according to another embodiment of the disclosure. The display apparatus 10E depicted in FIG. 8 is similar to the display apparatus 10 depicted in FIG. 2, while the difference therebetween lies in that the connecting surface 140c of the display apparatus 10E is different from the connecting surface 140c of the display apparatus 10. With reference to FIG. 8, specifically, in this embodiment, the connecting surface 140c of the protection adhesive 140 of each of the display panels 100 includes a first sub-connecting surface 140c-1 connecting the first surface 130a and a second sub-connecting surface 140c-2 connecting the first sub-connecting surface 140c-1 and the second surface 140b. Here, the first sub-connecting surface 140c-1 and the second sub-connecting surface 140c-2 are intersected; namely, the first sub-connecting surface 140c-1 and the second sub-connecting surface 140c-2 are not parallel to each other. For instance, in this embodiment, the first sub-connecting surface 140c-1 and the second sub-connecting surface 140c-2 of the first display panel 100-1 may be connected to form a concave bent surface, and the first sub-connecting surface 140c-1 and the second sub-connecting surface 140c-2 of the second display panel 100-2 may be connected to form a convex bent surface.

Figure 9:
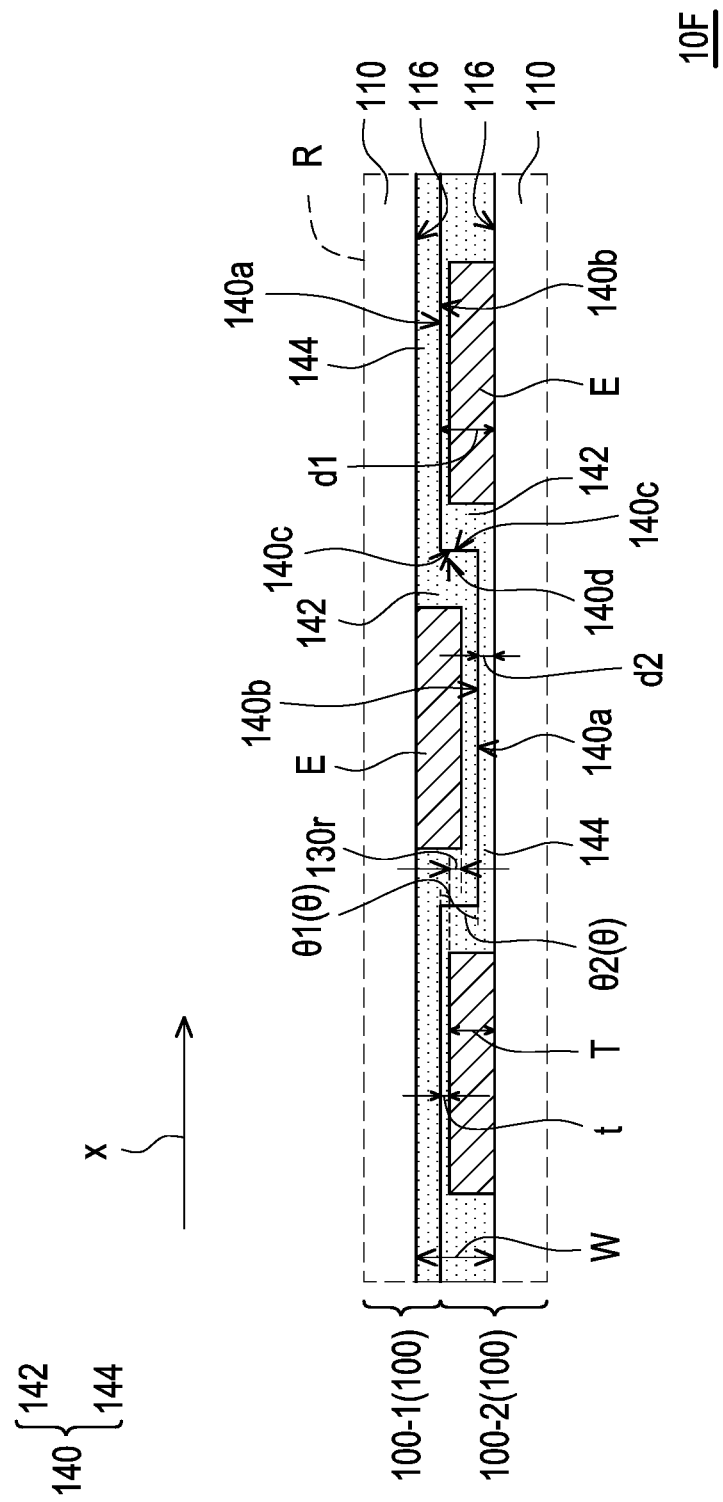
FIG. 9 is a schematic partial enlarged view of a display apparatus 10F according to still another embodiment of the disclosure.

FIG. 9 is a schematic partial enlarged view of a display apparatus 10F according to still another embodiment of the disclosure. The display apparatus 10F depicted in FIG. 9 is similar to the display apparatus 10 depicted in FIG. 2, while the difference therebetween lies in that the conductive device E of the first display panel 100-1 and the conductive device E of the second display panel 100-2 are partially overlapped in a direction x. Namely, in the embodiment depicted in FIG. 9, the conductive device E of the first display panel 100-1 has a region 130r where the conductive device E of the first display panel 100-1 and the conductive device E of the second display panel 100-2 are overlapped in the direction x.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display apparatus, comprising:
    at least one display panel, comprising:
        a substrate, having a front surface, a back surface opposite to the front surface, and a sidewall connecting the front surface and the back surface;
        a pixel array, disposed on the front surface of the substrate;
        a conductive device, disposed at least on the sidewall of the substrate and electrically connected to the pixel array; and
        a protection adhesive, disposed at least on the sidewall of the substrate and covering the conductive device, wherein the protection adhesive has a first surface, a second surface, and a connecting surface which are disposed opposite to the sidewall of the substrate, the first surface is located on the conductive device, a distance between the first surface and the sidewall of the substrate is greater than a distance between the second surface and the sidewall of the substrate, and the connecting surface is connected to the first surface and the second surface.

2. The display apparatus according to claim 1, wherein an angle is included between the connecting surface and the second surface within the protection adhesive, and the angle is substantially equal to 90°.

3. The display apparatus according to claim 1, wherein an angle is included between the connecting surface and the second surface within the protection adhesive, and the angle is greater than 0° and less than 90°.

4. The display apparatus according to claim 1, wherein the connecting surface comprises a curved surface.

5. The display apparatus according to claim 1, wherein the connecting surface comprises:
    a first sub-connecting surface, connected to the first surface; and
    a second sub-connecting surface, connected to the first sub-connecting surface and the second surface, wherein the first sub-connecting surface and the second sub-connecting surface are intersected.

6. The display apparatus according to claim 1, wherein the protection adhesive comprises:
    a protruding portion, covering the conductive device and having the first surface and the connecting surface of the protection adhesive; and
    a flat portion, having the second surface of the protection adhesive, wherein the protruding portion protrudes from the flat portion and is connected to the flat portion, so as to define a recess of the protection adhesive.

7. The display apparatus according to claim 6, wherein the number of the at least one display panel is plural, each of the display panels comprises the substrate, the pixel array, the conductive device, and the protection adhesive, the display panels comprise a first display panel and a second display panel, and the protruding portion of the protection adhesive of the first display panel is disposed in the recess of the protection adhesive of the second display panel.

8. The display apparatus according to claim 7, wherein a direction is substantially parallel to the sidewall of the substrate of the first display panel, and the conductive device of the first display panel and the conductive device of the second display panel are partially overlapped in the direction.

9. The display apparatus according to claim 7, wherein in each of the display panels, an angle is included between the connecting surface and the second surface within the protection adhesive, and the angle in the first display panel is substantially equal to the angle in the second display panel.

10. The display apparatus according to claim 7, wherein in each of the display panels, an angle is included between the connecting surface and the second surface within the protection adhesive, and the angle in the first display panel is greater than the angle in the second display panel.

11. The display apparatus according to claim 7, wherein in each of the display panels, an angle is included between the connecting surface and the second surface within the protection adhesive, and the angle in the first display panel is less than the angle in the second display panel.

* * * * *